United States Patent
Essawy et al.

(10) Patent No.: US 11,061,080 B2
(45) Date of Patent: *Jul. 13, 2021

(54) REAL TIME OPERATIONAL LEAKAGE CURRENT MEASUREMENT FOR PROBE HEATER PHM AND PREDICTION OF REMAINING USEFUL LIFE

(71) Applicant: Rosemount Aerospace Inc., Burnsville, MN (US)

(72) Inventors: Magdi A. Essawy, Lakeville, MN (US); Minh Bui, Blaine, MN (US); John D. Gasser, Minneapolis, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 36 days.

This patent is subject to a terminal disclaimer.

(21) Appl. No.: 16/220,850

(22) Filed: Dec. 14, 2018

(65) Prior Publication Data

US 2020/0191851 A1   Jun. 18, 2020

(51) Int. Cl.
  *G01R 31/02*   (2006.01)
  *G01R 31/28*   (2006.01)
  (Continued)

(52) U.S. Cl.
  CPC ........... *G01R 31/58* (2020.01); *G01P 5/14* (2013.01); *G01R 31/2836* (2013.01)

(58) Field of Classification Search
  CPC .... G01R 31/00; G01R 31/006; G01R 31/008; G01R 31/08; G01R 31/10; G01R 31/12; G01R 31/1245; G01R 31/1272; G01R 31/28; G01R 31/2831; G01R 31/2836; G01R 31/50; G01R 31/52; G01R 31/54; G01R 31/55; G01R 31/56; G01R 31/58;
  (Continued)

(56) References Cited

U.S. PATENT DOCUMENTS 3,798,652 A   3/1974 Williams
4,207,566 A   6/1980 Gitlin et al.
(Continued)

FOREIGN PATENT DOCUMENTS

CA   1311028   5/1989
CN   105092050 A   11/2015
(Continued)

OTHER PUBLICATIONS

Bechhoefer, John, et al. "Temperature Dependence of the Capacitance of a Ferroelectric Material." in: American Journal of Physics (2007), vol. 75, No. 11, pp. 1046-1053.
(Continued)

*Primary Examiner* — Hoai-An D. Nguyen
(74) *Attorney, Agent, or Firm* — Kinney & Lange, P.A.

(57) ABSTRACT

A system for an aircraft includes a heater comprising a resistive heating element and insulation surrounding the resistive heating element. A first current flows into the resistive heating element to provide heat and a second current flows out of the resistive heating element. The system further includes a leakage sensor configured to produce a leakage sensor signal representing a leakage current from the heater and a prediction processor configured to predict heater failure based on the leakage sensor signal.

16 Claims, 6 Drawing Sheets

(51) Int. Cl.
*G01P 5/14* (2006.01)
*G01R 31/58* (2020.01)

(58) Field of Classification Search
CPC ........ G01R 27/00; G01R 27/02; G01R 27/08; G01R 27/16; G01R 27/18; G01R 27/26; G01R 27/2617; G01R 31/021; G01P 5/00; G01P 5/14; G01P 5/165; G01P 13/025; G05B 23/02; H01C 7/13; H04L 41/0677
USPC ....... 324/500, 503, 509, 512, 522, 523, 527, 324/528, 531, 537, 539, 541, 533, 544, 324/551, 555, 557, 600, 649, 691, 713, 324/715, 718; 702/57, 58, 59, 127, 182, 702/183, 185; 340/1.1, 3.1, 3.42, 3.43, 340/3.44, 500, 540, 635, 647; 361/1, 88, 361/93.1
See application file for complete search history.

(56) References Cited

U.S. PATENT DOCUMENTS

| | | | |
|---|---|---|---|
| 4,267,721 A | 5/1981 | Longenecker et al. | |
| 4,506,259 A | 3/1985 | Rhodes | |
| 4,698,583 A | 10/1987 | Sandberg | |
| 5,130,652 A * | 7/1992 | Kawakami | G01N 27/902 324/238 |
| 5,216,226 A | 6/1993 | Miyoshi | |
| 5,218,294 A | 6/1993 | Soiferman | |
| 5,464,965 A | 11/1995 | McGregor et al. | |
| 5,767,781 A | 6/1998 | Yavelberg | |
| 5,883,512 A | 3/1999 | Streit et al. | |
| 6,070,475 A | 6/2000 | Muehlhauser et al. | |
| 6,107,611 A | 8/2000 | Jones | |
| 6,151,560 A | 11/2000 | Jones | |
| 6,188,423 B1 | 2/2001 | Pou | |
| 6,218,647 B1 | 4/2001 | Jones | |
| 6,270,460 B1 | 8/2001 | McCartan et al. | |
| 6,300,767 B1 | 10/2001 | Kliman et al. | |
| 6,336,083 B1 | 1/2002 | Lanham et al. | |
| 6,400,334 B1 | 6/2002 | Lindenmeier et al. | |
| 6,414,282 B1 | 7/2002 | Ice et al. | |
| 6,414,508 B1 | 7/2002 | London | |
| 6,430,996 B1 | 8/2002 | Anderson et al. | |
| 6,476,624 B1 | 11/2002 | Chuman et al. | |
| 6,906,537 B2 | 6/2005 | Goldberg et al. | |
| 7,012,538 B2 | 3/2006 | Peck et al. | |
| 7,202,451 B2 | 4/2007 | Uchida et al. | |
| 7,209,651 B1 | 4/2007 | Knoeppel et al. | |
| 7,219,023 B2 | 5/2007 | Banke et al. | |
| 7,490,510 B2 | 2/2009 | Agami et al. | |
| 7,647,843 B2 | 1/2010 | Burton | |
| 8,182,143 B2 | 5/2012 | Fleming et al. | |
| 8,269,513 B2 | 9/2012 | Palm et al. | |
| 8,466,390 B2 | 6/2013 | Gaertner, II et al. | |
| 8,711,008 B2 | 4/2014 | Cook et al. | |
| 8,890,703 B2 | 11/2014 | Farris et al. | |
| 9,046,899 B2 | 6/2015 | Shearer et al. | |
| 9,080,917 B2 | 7/2015 | Nguyen et al. | |
| 9,463,879 B2 | 10/2016 | Khozikov et al. | |
| 9,733,135 B2 | 8/2017 | Feau et al. | |
| 9,885,761 B2 | 2/2018 | Schram | |
| 9,919,812 B2 | 3/2018 | Shi | |
| 9,927,480 B2 | 3/2018 | Nesnidal | |
| 9,939,459 B2 | 4/2018 | Dichek | |
| 10,151,785 B2 | 12/2018 | Essawy et al. | |
| 10,180,449 B2 | 1/2019 | Essawy et al. | |
| 10,197,517 B2 | 2/2019 | Essawy et al. | |
| 10,564,203 B2 | 2/2020 | Essawy et al. | |
| 2001/0054611 A1 | 12/2001 | Miyahara et al. | |
| 2002/0078752 A1 | 6/2002 | Braunling et al. | |
| 2002/0154029 A1 | 10/2002 | Watters et al. | |
| 2003/0206111 A1 | 11/2003 | Gao et al. | |
| 2004/0032270 A1 * | 2/2004 | Goldberg | G01K 1/026 324/721 |
| 2004/0075567 A1 | 4/2004 | Peck et al. | |
| 2004/0124358 A1 | 7/2004 | Okamura et al. | |
| 2004/0217106 A1 * | 11/2004 | Giterman | H05B 1/0236 219/486 |
| 2004/0243949 A1 * | 12/2004 | Wang | G06F 30/367 716/112 |
| 2005/0200363 A1 | 9/2005 | Hasegawa et al. | |
| 2005/0232331 A1 | 10/2005 | Severson | |
| 2005/0232332 A1 | 10/2005 | Hanson et al. | |
| 2006/0033504 A1 | 2/2006 | Barber et al. | |
| 2006/0096971 A1 | 5/2006 | Reusche et al. | |
| 2006/0250143 A1 | 11/2006 | Moon et al. | |
| 2007/0084857 A1 | 4/2007 | Osaka | |
| 2007/0125764 A1 | 6/2007 | Knoeppel et al. | |
| 2007/0208520 A1 | 9/2007 | Zhang et al. | |
| 2008/0018340 A1 | 1/2008 | Amou et al. | |
| 2008/0112100 A1 * | 5/2008 | Liu | H02H 3/33 361/45 |
| 2008/0183404 A1 | 7/2008 | Emami et al. | |
| 2008/0250796 A1 | 10/2008 | Clugston et al. | |
| 2009/0055036 A1 | 2/2009 | Vozhdaev et al. | |
| 2009/0065502 A1 | 3/2009 | Suenaga et al. | |
| 2009/0251152 A1 | 10/2009 | Ammann | |
| 2009/0321415 A1 | 12/2009 | Zhang et al. | |
| 2010/0108662 A1 | 5/2010 | Taylor et al. | |
| 2010/0156426 A1 | 6/2010 | Kang et al. | |
| 2010/0163433 A1 | 7/2010 | Horn | |
| 2010/0213960 A1 | 8/2010 | Mok et al. | |
| 2010/0231249 A1 | 9/2010 | Dang et al. | |
| 2011/0036160 A1 * | 2/2011 | Pineau | G01P 13/025 73/170.02 |
| 2011/0058397 A1 | 3/2011 | Rizzo | |
| 2011/0089958 A1 | 4/2011 | Malecki et al. | |
| 2011/0106475 A1 | 5/2011 | Wigen | |
| 2011/0118990 A1 | 5/2011 | Sidhu et al. | |
| 2011/0290784 A1 | 12/2011 | Orawetz et al. | |
| 2011/0320139 A1 | 12/2011 | Amir et al. | |
| 2012/0133384 A1 | 5/2012 | Palais et al. | |
| 2012/0213246 A1 | 8/2012 | Honbo et al. | |
| 2012/0268074 A1 | 10/2012 | Cooley et al. | |
| 2012/0319706 A1 | 12/2012 | Nadel et al. | |
| 2013/0039565 A1 | 2/2013 | Takeshima et al. | |
| 2013/0194101 A1 | 8/2013 | Devupalli | |
| 2013/0314082 A1 | 11/2013 | Lee et al. | |
| 2014/0033175 A1 | 1/2014 | Lee et al. | |
| 2014/0103938 A1 | 4/2014 | Jones | |
| 2014/0238968 A1 * | 8/2014 | Lee | H05B 3/565 219/209 |
| 2014/0245830 A1 | 9/2014 | Martin et al. | |
| 2014/0331751 A1 | 11/2014 | Macdonald | |
| 2015/0014303 A1 | 1/2015 | Kohler et al. | |
| 2015/0042980 A1 | 2/2015 | Liu et al. | |
| 2015/0055940 A1 | 2/2015 | Steinhauser | |
| 2015/0104888 A1 | 4/2015 | Lee | |
| 2015/0123688 A1 | 5/2015 | Sappok et al. | |
| 2015/0142343 A1 | 5/2015 | Zach et al. | |
| 2015/0160148 A1 | 6/2015 | Stanley | |
| 2015/0174843 A1 * | 6/2015 | Crepin | B29C 70/021 264/258 |
| 2016/0013169 A1 | 1/2016 | Standing | |
| 2016/0054233 A1 | 2/2016 | Bense et al. | |
| 2016/0084986 A1 | 3/2016 | Zach et al. | |
| 2016/0131690 A1 | 5/2016 | Ueno et al. | |
| 2016/0131691 A1 | 5/2016 | Nesnidal | |
| 2016/0178221 A1 * | 6/2016 | Thornton | G01K 1/026 700/295 |
| 2016/0178680 A1 | 6/2016 | Ntziachristos | |
| 2016/0255184 A1 | 9/2016 | Hwang | |
| 2016/0291051 A1 | 10/2016 | Golly et al. | |
| 2016/0313259 A1 | 10/2016 | Shayovitz | |
| 2016/0338569 A1 | 11/2016 | Reder et al. | |
| 2016/0364629 A1 | 12/2016 | Solli | |
| 2016/0377487 A1 | 12/2016 | Cheung et al. | |
| 2017/0099699 A1 * | 4/2017 | Nosrati | H05B 3/48 |
| 2017/0110887 A1 | 4/2017 | Bell et al. | |
| 2017/0167925 A1 | 6/2017 | Safai et al. | |
| 2017/0182447 A1 | 6/2017 | Sappok et al. | |
| 2017/0191875 A1 | 7/2017 | Schmidt et al. | |
| 2017/0215936 A1 | 8/2017 | Wallace | |

(56) References Cited

U.S. PATENT DOCUMENTS

| | | |
|---|---|---|
| 2017/0259927 A1 | 9/2017 | Schram |
| 2017/0299626 A1 | 10/2017 | Dichek |
| 2017/0336156 A1 | 11/2017 | Phillips |
| 2017/0343418 A1 | 11/2017 | Hurbi et al. |
| 2017/0370748 A1 | 12/2017 | Fuller |
| 2017/0370960 A1 | 12/2017 | Benning et al. |
| 2017/0374296 A1 | 12/2017 | Schmidt |
| 2018/0123441 A1 | 5/2018 | Yanai |
| 2018/0183404 A1 | 6/2018 | Jourdan et al. |
| 2018/0275080 A1 | 9/2018 | Essawy et al. |
| 2018/0275085 A1 | 9/2018 | Fok et al. |
| 2018/0275181 A1 | 9/2018 | Essawy et al. |
| 2018/0275182 A1 | 9/2018 | Essawy et al. |
| 2018/0275183 A1 | 9/2018 | Essawy et al. |
| 2018/0275184 A1 | 9/2018 | Essawy et al. |
| 2018/0275185 A1 | 9/2018 | Essawy et al. |
| 2018/0290756 A1 | 10/2018 | White et al. |
| 2019/0297675 A1* | 9/2019 | Vadgaonkar .......... G01P 21/025 |
| 2020/0011761 A1 | 1/2020 | Pado |
| 2020/0191850 A1 | 6/2020 | Essawy et al. |

FOREIGN PATENT DOCUMENTS

| | | |
|---|---|---|
| CN | 109246868 A | 1/2019 |
| CN | 109521252 A | 3/2019 |
| EP | 1441429 A1 | 7/2004 |
| EP | 2755443 A2 | 7/2014 |
| EP | 3018057 A1 | 5/2016 |
| EP | 3281874 A1 | 2/2018 |
| EP | 3379266 A1 | 9/2018 |
| GB | 809608 | 2/1959 |
| GB | 884415 | 12/1961 |
| GB | 2561393 A | 10/2018 |
| JP | 2006088391 A | 4/2006 |
| JP | 2012198123 A | 10/2012 |
| KR | 20110124542 A | 11/2011 |
| KR | 101110789 B1 | 2/2012 |
| KR | 20120062301 A | 6/2012 |
| WO | WO9011532 A1 | 10/1990 |
| WO | WO9816837 A1 | 4/1998 |
| WO | WO9943066 A1 | 8/1999 |
| WO | WO2011026740 A1 | 3/2011 |
| WO | WO2013107371 A1 | 7/2013 |

OTHER PUBLICATIONS

Extended European Search Report for European Patent Application No. 18153822.4, dated May 17, 2018, 9 pages.
Communication Pursuant to Article 94(3) EPC for European Patent Application No. 18153822.4, dated Jan. 16, 2020, 4 pages.
Extended European Search Report for European Patent Application No. 18153825.7, dated Apr. 9, 2018, 7 pages.
Extended European Search Report for European Patent Application No. 19207401.1, dated Jan. 27, 2020, 8 pages.
Extended European Search Report for European Patent Application No. 18153830.7, dated May 23, 2018, 9 pages.
Extended European Search Report for European Patent Application No. 18153832.3, dated May 24, 2018, 9 pages.
Extended European Search Report for European Patent Application No. 19205621.6, dated Nov. 22, 2019, 9 pages.
Extended European Search Report for European Patent Application No. 18153834.9, dated May 29, 2018, 9 pages.
Extended European Search Report for European Patent Application No. 19203208.4, dated Nov. 18, 2019, 7 pages.
Extended European Search Report for European Patent Application No. 18153824.0, dated May 17, 2018, 9 pages.
Communication Pursuant to Article 94(3) EPC for European Patent Application No. 18153824.0, dated Jun. 12, 2019, 7 pages.
Communication Pursuant to Article 94(3) EPC for European Patent Application No. 18153824.0, dated Jan. 16, 2020, 5 pages.
Extended European Search Report for European Patent Application No. 18162251.5, dated Jul. 5, 2018, 9 pages.
Communication Pursuant to Article 94(3) EPC for European Patent Application No. 18162251.5, dated Jun. 12, 2019, 3 pages.
Cedric Gillet and Andreas Freidrich, "Guidelines for Designing a Concentrator for High-Current Sensing Applications with an Allegro Hall-Effect Sensor IC", 2013, 7 pages.
Magnetics Division of Sprang & Company, Technical Bulletin "Magnetic Cores for Hall Effect Devices", 1997, 6 pages.
Extended European Search Report for European Patent Application No. 19214929.2, dated May 4, 2020, 8 pages.
Extended European Search Report for European Patent Application No. 19216159.4, dated May 28, 2020, 9 pages.
Extended European Search Report for European Patent Application No. 19213783.4, dated Jun. 23, 2020, 7 pages.
Extended European Search Report for European Patent Application No. 19216276.6, dated Jul. 6, 2020, 10 pages.
Taheri S. et al.: "Equivalent Surface conductivity of ice accumulated on insulators during development of AC and DC flashovers arcs", IEEE Transactions on Dielectrics and Electrical Insulation, IEEE Service Center, Piscatawy, NJ, US, vol. 20, No. 5 Oct. 1, 2013, pp. 1789-1798, XP011530972, ISSN: 1070-9878.
Extended European Search Report for European Patent Application No. 19215831.9, dated Jul. 3, 2020, 11 pages.

* cited by examiner

REAL TIME OPERATIONAL LEAKAGE CURRENT MEASUREMENT FOR PROBE HEATER PHM AND PREDICTION OF REMAINING USEFUL LIFE

BACKGROUND

The present disclosure relates generally to probes, and in particular to prognostics for air data probes.

Probes are utilized to determine characteristics of an environment. In aircraft systems, for example, air data probes may be implemented on the external portions of the aircraft to aid in determination of conditions such as airspeed, altitude, and angle of attack, among others. Due to the harsh conditions of flight at high altitudes, ice may build-up on portions of the air data probe. To combat this, heaters are implemented within the air data probe to prevent the formation of ice that may impact proper functionality of the air data probe.

When air data probes break down, they need to be replaced, often prior to a subsequent takeoff. The heater of an air data probe is often the most life-limited part. Therefore, air data probes need to be replaced as soon as the heater breaks down. It is desirable to predict when the air data probe will require replacement.

SUMMARY

A system for an aircraft includes a heater comprising a resistive heating element and insulation surrounding the resistive heating element. A first current flows into the resistive heating element to provide heat and a second current flows out of the resistive heating element. The system further includes a leakage sensor configured to produce a leakage sensor signal representing a leakage current from the heater and a prediction processor configured to predict heater failure based on the leakage sensor signal.

A system for an aircraft includes a heater comprising a resistive heating element and insulation surrounding the resistive heating element. A first current flows into the resistive heating element to provide heat and a second current flows out of the resistive heating element. The system further comprises a first sensor configured to produce a first sensor signal representing the first current, a second sensor configured to produce a second sensor signal representing the second current, and a prediction processor configured to predict heater failure based on the first sensor signal and the second sensor signal.

DETAILED DESCRIPTION

In general, the present disclosure describes sampling and measuring operational (real time) insulation leakage current in order to predict heater failure and remaining useful life of the heater.

Figure 1:
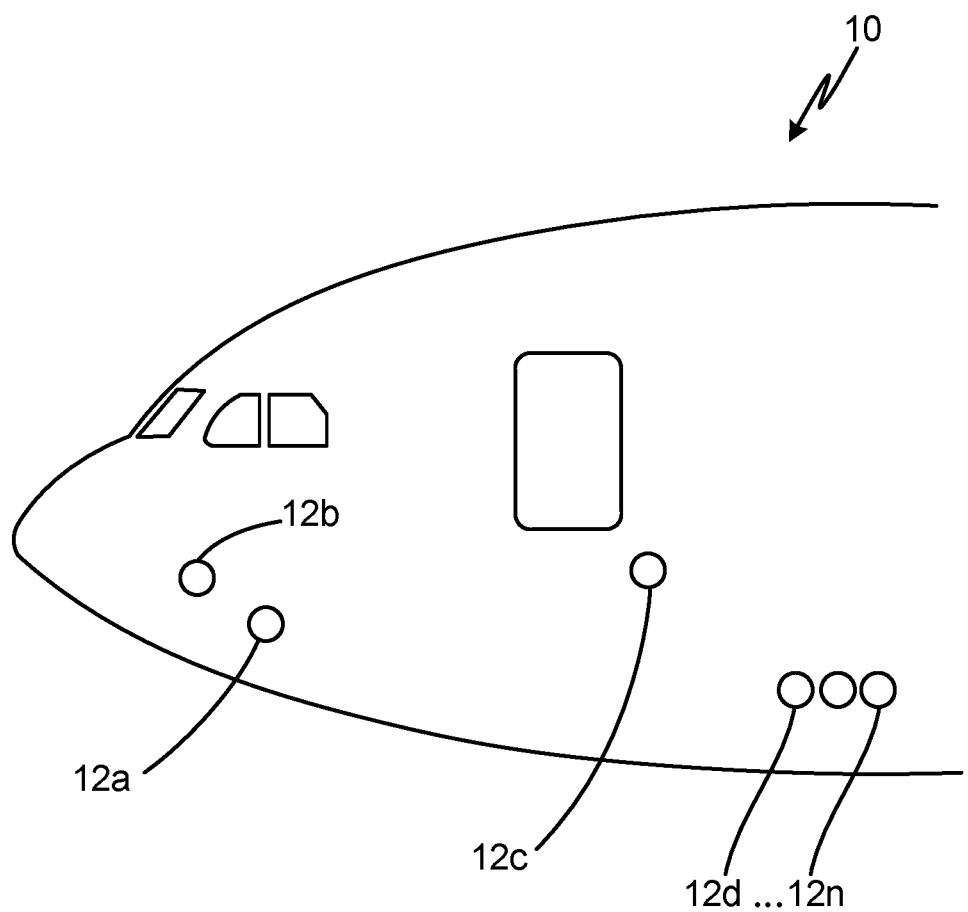
FIG. 1 is a diagram illustrating an aircraft that includes a plurality of air data probes.

FIG. 1 is a diagram illustrating aircraft 10 that includes a plurality of air data probes 12a-12n. While illustrated as a commercial aircraft, other vehicles, such as unmanned aerial vehicles, helicopters and ground vehicles may also include air data probes 12a-12n configured to sense characteristics of the environment. Air data probes 12a-12n are aircraft components. Air data probes 12a-12n may be any type of probe such as, but not limited to, pitot probes, pitot-static probes, total air temperature (TAT) probes, angle-of-attack (AOA) sensors, and any other probes that may include a heater.

Figure 2A:
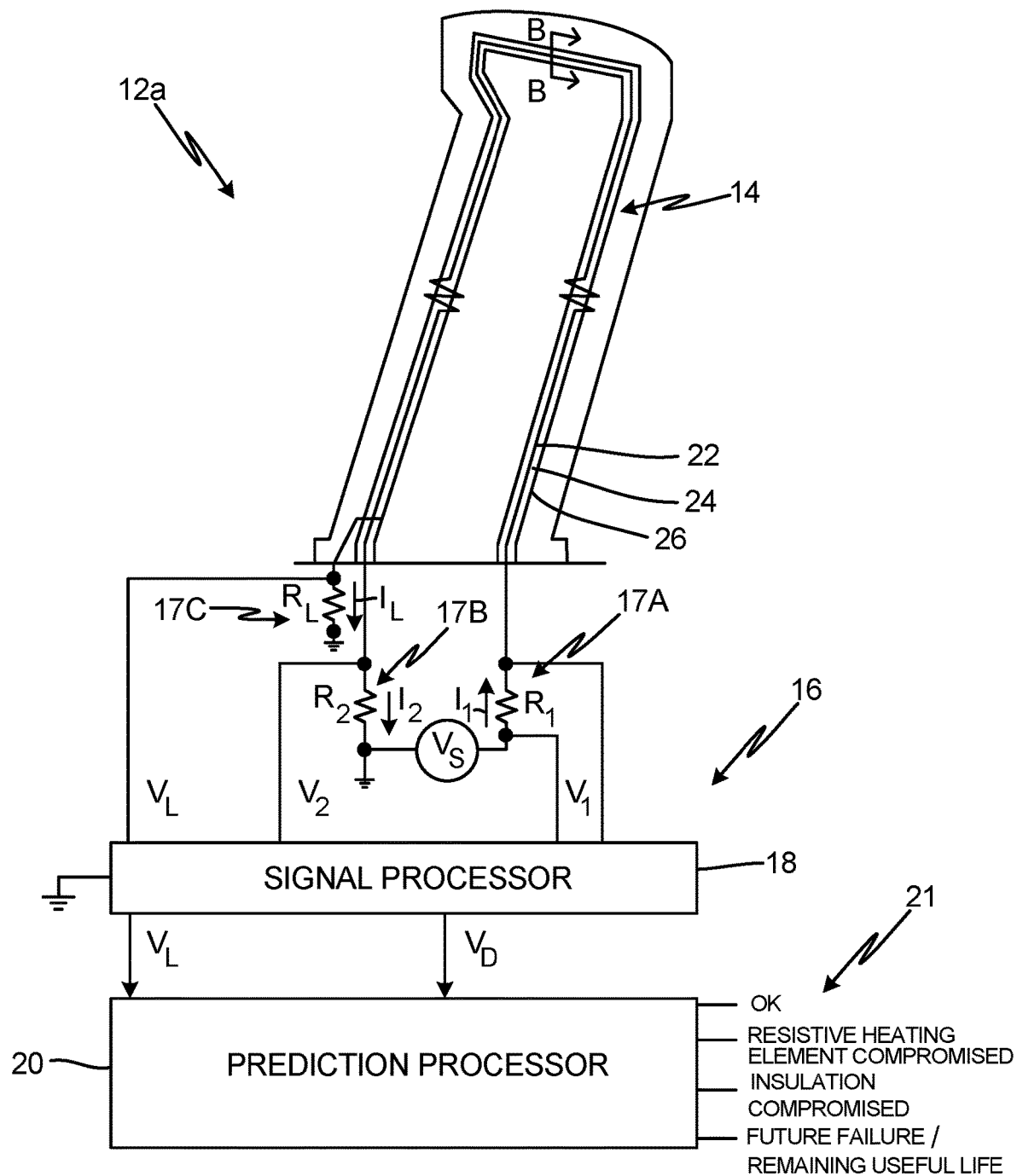
FIG. 2A is a diagram of an air data probe that includes a heater and circuitry that is electrically connected to the heater.
Figure 2B:
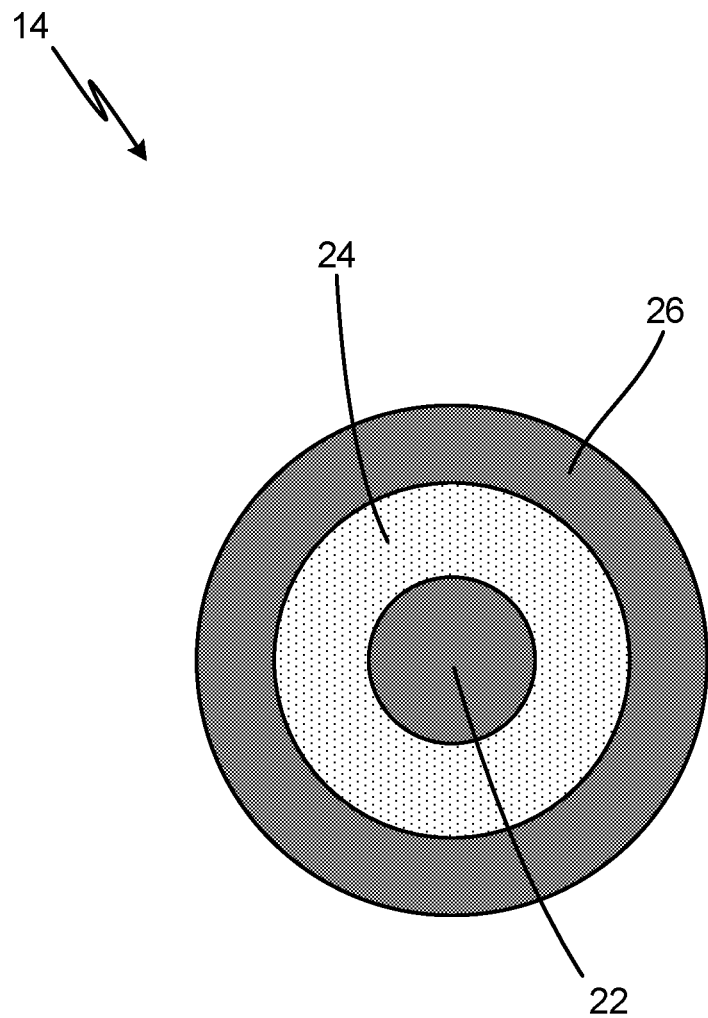
FIG. 2B is a cross-sectional view of the heater of the air data probe taken along line B-B of FIG. 2A.
Figure 3:
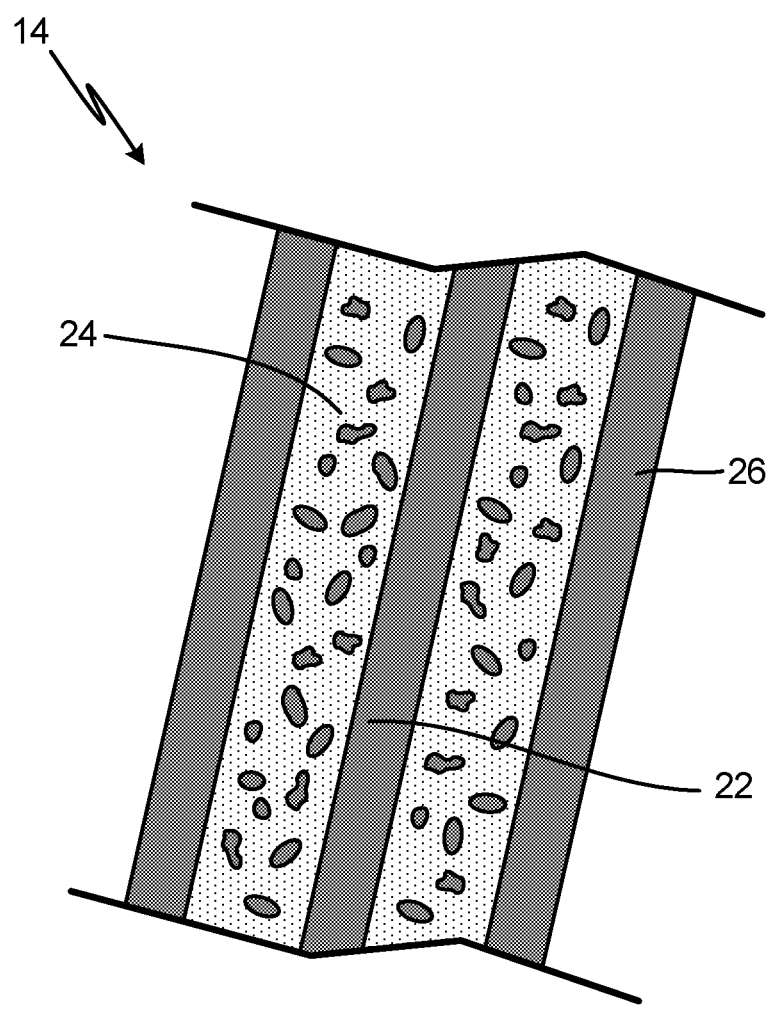
FIG. 3 is a partial cross-sectional view illustrating the heater with compromised insulation.
Figure 4:
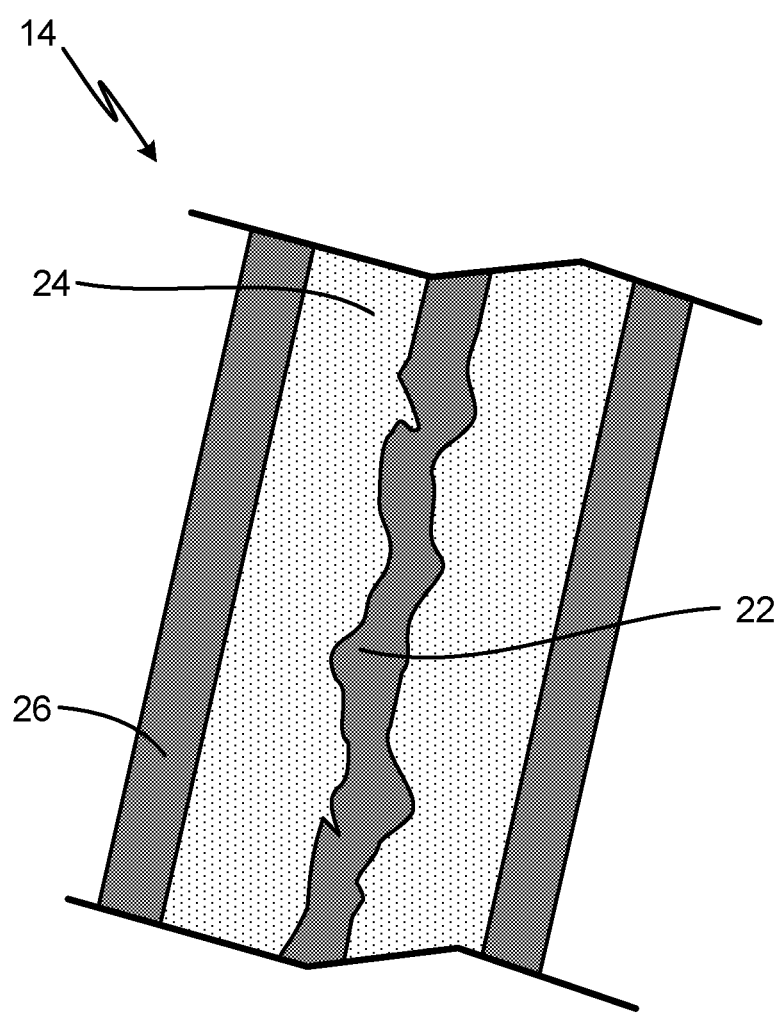
FIG. 4 is a partial cross-sectional view illustrating the heater with a compromised resistive heating element.

FIG. 2A is a diagram of air data probe 12a that includes heater 14 and circuitry 16 that is electrically connected to heater 14. While illustrated in FIG. 2A as a TAT probe 12a, air data probe 12a may be any other type of air data probe 12a-12n or sensing element. FIG. 2B is a cross-sectional view of heater 14 of air data probe 12a taken along line B-B of FIG. 2A. FIG. 3 is a partial cross-sectional view illustrating heater 14 with compromised insulation 24. FIG. 4 is a partial cross-sectional view illustrating heater 14 with compromised resistive heating element 22. FIGS. 2A, 2B, 3, and 4 will be discussed together.

Air data probe 12a is an aircraft component and includes heater 14. Air data probe 12a is electrically connected to circuitry 16, which includes voltage source Vs, first sensor 17A, second sensor 17B, leakage sensor 17C, signal processor 18, and prediction processor 20. Heater 14 includes resistive heating element 22, insulation 24, and sheath 26.

Heater 14, which may be a heater wire, for example, is routed through air data probe 12a and is electrically connected to circuitry 16 within aircraft 10. Heater 14 receives power from electrically connected voltage source Vs of circuitry 16 to provide heat for air data probe 12a. Voltage source Vs may provide direct current (DC) power or alternating current (AC) power to heater 14 depending on the type of air data probe 12a within which heater 14 is positioned. First current $I_1$ is main current flowing at a first end of heater 14. Second current $I_2$ is main current flowing at a second end of heater 14, which is opposite the first end of heater 14. For example, as seen in FIG. 2A, first current $I_1$ (which may be DC or AC current) flows into heater 14, and second current $I_2$ (which may be DC or AC current) flows out of heater 14. First sensor 17A is a first current sensor. First current $I_1$ flows through first sensor 17A to produce a sensed voltage, or first sensor signal $V_1$. In this embodiment, first sensor 17A is first sense resistor $R_1$. Second sensor 17B is a second current sensor. Second current $I_2$ flows through second sensor 17B to produce a sensed voltage, or second sensor signal $V_2$. In this embodiment, second sensor 17B is second sense resistor $R_2$. First sense resistor $R_1$ and second sense resistor $R_2$ are in series with heater 14. Leakage current $I_l$ is current that has leaked from heater 14 to electrical ground. Leakage current $I_l$ flows through leakage sensor 17C to produce a sensed voltage, or leakage sensor signal $V_L$. In this embodiment, leakage sensor 17C is leakage sense resistor $R_L$ connected between heater 14 and electrical ground. Because first sense resistor $R_1$, second sense resistor $R_2$, and leakage sense resistor $R_L$ are known resistors, first sensor signal $V_1$, second sensor signal $V_2$, and leakage sensor signal $V_L$ have known relationships to first current $I_1$, second current $I_2$, and leakage $I_l$.

First sensor signal $V_1$, second sensor signal $V_2$, and leakage sensor signal $V_L$, which represent first current $I_1$, second current $I_2$, and leakage current $I_L$, respectively, vary as a function of time. In alternate embodiments, first sensor 17A, second sensor 17B, and leakage sensor 17C may be any suitable sensors.

Signal processor 18 is electrically connected to heater 14. Time varying first sensor signal $V_1$, second sensor signal $V_2$, and leakage sensor signal $V_L$ are provided to signal processor 18. Signal processor 18 creates time varying difference voltage $V_D$ by subtracting second sensor signal $V_2$ from first sensor signal $V_1$. First sensor signal $V_1$ and second sensor signal $V_2$ are representative of current at opposite ends of heater 14, or current flowing into heater 14 and current flowing out of heater 14. Thus, difference voltage $V_D$ represents the difference between first current $I_1$ and second current $I_2$, which is representative of current that has leaked from heater 14 (and is therefore equal to leakage sensor signal $V_L$), as a function of time. Difference voltage $V_D$ and/or leakage sensor signal $V_L$ are amplified and digitized at signal processor 18. Signal processor 18 outputs difference voltage VD and leakage sensor signal $V_L$ in the time domain. Difference voltage $V_D$ and/or leakage sensor signal $V_L$ as functions of time indicate whether heater 14 is becoming compromised.

Prediction processor 20 is electrically connected to signal processor 18 to receive leakage sensor signal $V_L$ and/or difference voltage $V_D$ in the time domain from signal processor 18. Prediction processor 20 uses leakage sensor signal $V_L$ and/or difference voltage $V_D$ to output status 21 of heater 14. Heater 14 may have a status 21 of OK, RESISTIVE HEATING ELEMENT COMPROMISED, INSULATION COMPROMISED, and/or FUTURE FAILURE/REMAINING USEFUL LIFE.

As seen in FIG. 2B, heater 14 has resistive heating element 22, which is a resistor that receives first current $I_1$ from a first terminal of voltage source Vs and returns second current $I_2$ to a second terminal of voltage source Vs. First current $I_1$ flows into resistive heating element 22, and second current $I_2$ flows out of resistive heating element 22. As such, first sense resistor $R_1$ and second sense resistor $R_2$ are in series with resistive heating element 22 at an inlet and outlet of resistive heating element 22. Resistive heating element 22 may be made of oxidation resistant material such as Nichrome, or any other suitable material. Insulation 24 surrounds resistive heating element 22. Insulation 24 may be made of silica, ceramic, or any other suitable insulating material. Sheath 26 is metallic and surrounds insulation 24 such that insulation 24 is between resistive heating element 22 and sheath 26. Sheath 26 may be made of nickel alloy, copper alloy, or any other suitable electrically conductive oxidation resistant material. Leakage sense resistor $R_L$ is connected between sheath 26 and electrical ground.

Heater 14 prevents ice from building up on air data probe 12a when air data probe 12a is exposed cold temperatures when flying at high altitudes. Voltage source Vs supplies power to resistive heating element 22 such that first current $I_1$ is provided to and driven through resistive heating element 22, producing the required heat for air data probe 12a, and second current $I_2$ flows out of resistive heating element 22.

Insulation 24 protects resistive heating element 22 and electrically insulates resistive heating element 22. For example, resistive heating element 22 is insulated from metallic sheath 26 by insulation 24. Sheath 26 protects resistive heating element 22 and insulation 24, such as by keeping moisture and contaminants from compromising insulation 24.

If sheath 26 cracks, oxygen, moisture, dust, carbon, oils, and other contaminants can leak through sheath 26 to insulation 24, and then to resistive heating element 22, causing the material of insulation 24 and resistive heating element 22 to oxidize, change properties, and/or otherwise break down. When insulation 24 becomes contaminated by such contaminants, insulation 24 becomes compromised, as shown in FIG. 2C. Compromised insulation 24 leads to insulation resistance failure and/or and eventual short circuit (where resistive heating element 22 shorts to sheath 26) and loss of function of heater 14. Resistive heating element 22 can also become compromised as a result of sheath 26 cracking and insulation 24 becoming compromised. Contaminants can reach resistive heating element 22 and cause resistive heating element 22 to oxidize and eventually crack, leading to an open circuit (a gap in resistive heating element 22) and loss of function of heater 14. As such, insulation 24 and resistive heating wire 22 may both become compromised.

Additionally, resistive heating element 22 can become compromised, as seen in FIG. 2D, and fail due to aging. For example, the heat generated by resistive heating element 22 can cause metal material of resistive heating element 22 to migrate, changing the shape of resistive heating element 22. Resistive heating element 22 may become bumpy, or some portions of resistive heating element 22 may become narrower while other portions of resistive heating element may become wider. Resistive heating element 22 can eventually deteriorate and/or crack, leading to an open circuit and loss of function of heater 14. As such, insulation 24 may still be intact and not compromised while resistive heating element 22 is compromised.

Reduction of insulation resistance, short circuit, and open circuit all represent failures of heater 14 as heater 14 is rendered non-functional. In early stages of failure of heater 14, insulation 24 starts to become compromised and resistance of insulation 24 decreases, resulting in an increase in leakage current $I_L$ (and an increase in the difference between first current $I_1$ and second current $I_2$). Compromised insulation 24 manifests as an increase in leakage sensor signal $V_L$ and/or difference voltage $V_D$ over time. Compromised resistive heating element 22 manifests itself as noise and spikes in leakage sensor signal $V_L$ and/or difference voltage $V_D$ over time as current starts to deflect off bumps or other shape changes of resistive heating element 22.

Signal processor 18 samples and measures first sensor signal $V_1$, second sensor signal $V_2$, and/or leakage sensor signal $V_L$, which represent first current $I_1$, second current $I_2$, and leakage current $I_L$, respectively, from heater 14 during operation of aircraft 10. Signal processor 18 may use a low frequency sampling rate, such as 1 KHz to 10 KHz (depending on the frequency content of first sensor signal $V_1$ and second sensor signal $V_2$). Because operational leakage current (represented by leakage sensor signal $V_L$ and/or difference voltage $V_D$) is an indicator of compromised insulation 24 or compromised resistive heating element 22, prediction processor 20 determines status 21 of heater 14 based on changes in leakage sensor signal $V_L$ and/or difference voltage $V_D$. Creating and measuring difference voltage $V_D$ can be an alternative method for measuring operational leakage current rather than measuring leakage sensor signal $V_L$. Operational leakage current is indicative of test leakage current. As such, an increase in leakage sensor signal $V_L$ and/or difference voltage $V_D$ indicates compromised insulation 24 while noise and spikes in leakage sensor signal $V_L$ and/or difference voltage $V_D$ indicates compromised resistive heating element 22. Prediction processor identifies compromised insulation 24 or compromised resistive heating element 22 based on leakage sensor signal $V_L$ and/or difference voltage $V_D$ to determine future failure of heater 14.

Prediction processor 20 predicts failure of heater 14 based on first sensor signal $V_1$, second sensor signal $V_2$, and/or leakage sensor signal $V_L$. Prediction processor 20 identifies that heater 14 is ok, that resistive heating element 22 is compromised, and/or that insulation 24 is compromised. Prediction processor 20 also determines remaining life of heater 22. Prediction processor 20 will output a status of OK, indicating heater 14 is functioning properly, when there is no significant increase in amplitude of leakage sensor signal $V_L$ and/or difference voltage $V_D$ and no noise or spikes in leakage sensor signal $V_L$ and/or difference voltage $V_D$. Prediction processor 20 will output status 21 of RESISTIVE HEATING ELEMENT COMPROMISED, indicating a future open circuit, when there are noise and/or spikes present in leakage sensor signal $V_L$ and/or difference voltage $V_D$. Prediction processor 20 will output status 21 of INSULATION COMPROMISED, indicating a future failure in insulation resistance testing or a future short circuit, when leakage sensor signal $V_L$ and/or difference voltage $V_D$ is elevated over time, identifiable by an increase in amplitude of leakage sensor signal $V_L$ and/or difference voltage $V_D$ over time. For example, compromise of insulation 24 may lead leakage sensor signal $V_L$ and/or difference voltage $V_D$ to increase by 200 times. As insulation resistance decreases, leakage sensor signal $V_L$ and/or difference voltage $V_D$ increase. Prediction processor 20 may output one or both of RESISTIVE HEATING ELEMENT COMPROMISED and INSULATION COMPROMISED statuses 21 at a given time. Prediction processor 20 will output a status of FUTURE FAILURE/REMAINING USEFUL LIFE, indicating the remaining useful life of heater 14, which prediction processor 20 determines based on signatures (specific shapes) and trends of time signal data representing leakage sensor signal $V_L$ and/or difference voltage $V_D$. Prediction processor 20 may make the same predictions using only leakage sensor signal $V_L$ (representing leakage current), if signal processor 18 does not create difference voltage $V_D$, or using only difference voltage $V_D$ (representing leakage current), if leakage sensor signal $V_L$ is not provided to signal processor 18.

Heater 14 ensures air data probe 12a is functioning properly. Heater 14 can abruptly fail as a result of an open circuit or short circuit, which causes a sudden loss of functionality of air data probe 12a. Additionally, heater 14 can fail insulation resistance testing when test leakage current reaches a certain value, indicating heater 14 is no longer fit for operation and causing a loss of functionality of air data probe 12a. Traditionally, leakage current is measured to test insulation resistance when the aircraft is not in operation, such as at the inception of the heater or at preventive maintenance intervals to ensure operational safety requirements are met. As a result, the resistive heating element is cold and high voltage (such as about 400 volts) is sent across the insulation during insulation resistance testing.

Loss of functionality of air data probe 12a can have severe flight control consequences. Because proper functioning of air data probe 12a is necessary for safe operation of aircraft 10, prognostics of heater 14 improves the reliability of air data probe 12a. Predicting future failure of heater 14 allows a user to replace heater 14 when necessary (such as between flights or at another convenient time) and prevents unpredictable failures of heater 14, which reduces flight delays and unpredictable failures, improves flight safety, and lowers aircraft maintenance and flight operation costs. Detecting compromise of resistive heating element 22 and/or compromise of insulation 24 of heater 14 using leakage sensor signal $V_L$ and/or difference voltage $V_D$ allows for prediction of failure of heater 14 much earlier, for example, long before failure will occur. Additionally, measuring leakage current (represented by leakage sensor signal $V_L$ and difference voltage $V_D$) when aircraft 10 is in operation allows for measurement while heater 14 is hot. Insulation resistance is lower when heater 14 is hot, resulting in a higher leakage current. Thus, measuring leakage current during operation results in a more accurate assessment of insulation resistance and future heater failure. Further, because both leakage sensor signal $V_L$ and difference voltage $V_D$ represent an operational leakage current and either can be analyzed to predict heater failure, multiple ways exist to measure operational leakage current to predict heater failure. Because difference voltage $V_D$ is calculated from first current $I_1$ and second current $I_2$, it is easy to measure difference voltage $V_D$ during operation.

Figure 5:
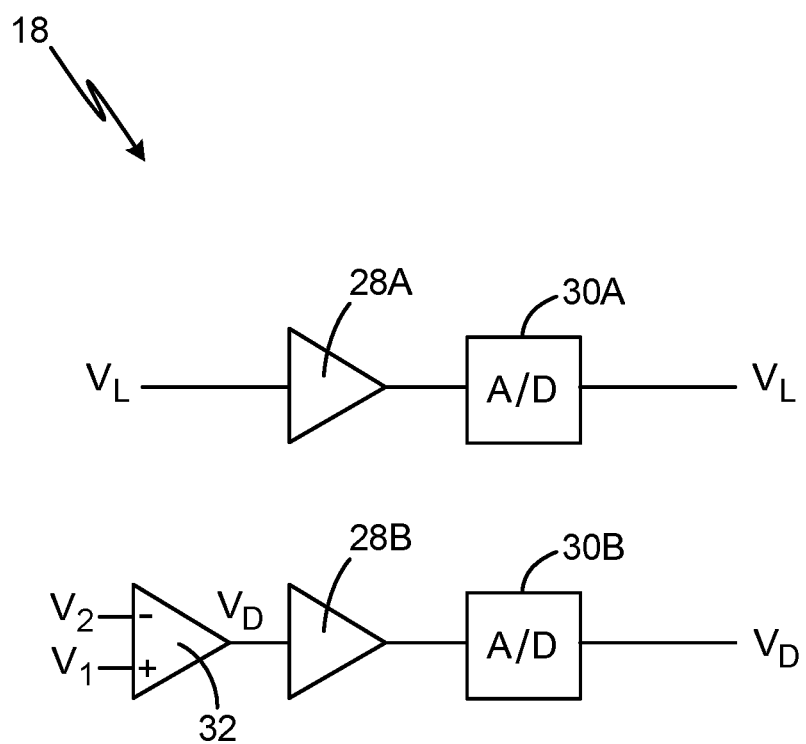
FIG. 5 is a diagram illustrating functions of a signal processor.

FIG. 5 is a diagram illustrating functions of signal processor 18, which include producing amplified and digitized leakage sensor signal $V_L$ and difference voltage $V_D$ as a function of time. Signal processor 18 carries out amplification using amplifiers 28A-28B and A/D conversion 30A-30B on leakage sensor signal $V_L$ and difference voltage $V_D$. Additionally, signal processor 18 includes comparator 32.

Signal processor 18 accepts leakage sensor signal $V_L$. Leakage sensor signal $V_L$ is a nominal voltage because aircraft 10, and thus heater 14, is in operation. Signal processor 18 amplifies leakage sensor signal $V_L$ using amplifier 28A and digitizes amplified leakage sensor signal $V_L$ using A/D converter 30A. Signal processor 18 produces amplified, digitized time domain data representing leakage sensor signal $V_L$, which represents operation leakage current $I_L$ of heater 14.

Signal processor 18 accepts first sensor signal $V_1$ and second sensor signal $V_2$. Signal processor 18 uses comparator 32 to subtract second sensor signal $V_2$ from first sensor signal $V_1$ to create difference voltage $V_D$. Difference voltage $V_D$ is a nominal voltage because aircraft 10, and thus heater 14, is in operation. Signal processor 18 amplifies difference voltage $V_D$ using amplifier 28B and digitizes amplified difference voltage $V_D$ using A/D converter 30B. Signal processor 18 produces amplified, digitized time domain data representing difference voltage $V_D$, which represents the difference between first current $I_1$ and second current $I_2$, or operational leakage current $I_L$ of heater 14.

Signal processor 18 samples first sensor signal $V_1$, second sensor signal $V_2$, leakage sensor signal $V_L$, and difference voltage $V_D$ at a suitable (potentially low) frequency rate. In alternate embodiments, signal processor 18 may sample at any suitable frequency rate. Leakage sensor signal $V_L$ and difference voltage $V_D$ are nominal values because leakage sensor signal $V_L$ and difference voltage $V_D$ are measured from nominal voltage and currents flowing through heater 14 during operation. As such, leakage sensor signal $V_L$ and difference voltage $V_D$ are much smaller than typical test leakage currents and higher resolution measurement devices and data acquisition instruments are used to measure such small values. For example, leakage current measured in regular insulation resistance testing uses high voltage that may be an order of magnitude higher than operational voltage of heater 14. Amplification of leakage sensor signal $V_L$ and difference voltage $V_D$ allows for digitization and storage of leakage sensor signal $V_L$ and difference voltage $V_D$ so that the time signature can be analyzed. Analysis of the time signatures and signal levels of leakage sensor signal $V_L$ and difference voltage $V_D$ can determine the presence of compromised insulation 24 and/or compromised resistive heating element 22, which are indicative of future heater failure due to open circuit or short circuit. Additionally, operational values of leakage sensor signal $V_L$ and difference voltage $V_D$ correlate with typical test leakage currents and can be used to estimate test leakage current and predict failure of insulation resistance testing. As a result, typical high voltage testing, which may negatively impact the life of insulation 24, is not required. Time domain data of sensor signal $V_L$ and difference voltage $V_D$ is delivered to prediction processor 20, which determines status 21 of heater 14 based off such data, including a remaining useful life of heater 14.

While described with respect to air data probes, such as air data probe 12a, heater 14 may be any heater of any suitable aircraft component, such as an aircraft wing ice protection heater, a water heater, a heated floor panel, or any other suitable electrical system.

Discussion of Possible Embodiments

The following are non-exclusive descriptions of possible embodiments of the present invention.

A system for an aircraft includes a heater comprising: a resistive heating element; and insulation surrounding the resistive heating element; wherein a first current flows into the resistive heating element to provide heat and a second current flows out of the resistive heating element; a leakage sensor configured to produce a leakage sensor signal representing a leakage current from the heater; and a prediction processor configured to predict heater failure based on the leakage sensor signal.

The system of the preceding paragraph can optionally include, additionally and/or alternatively, any one or more of the following features, configurations and/or additional components:

The system further comprises: a first sensor configured to produce a first sensor signal representing the first current; and a second sensor configured to produce a second sensor signal representing the second current; wherein the prediction processor is configured to predict heater failure based on the leakage sensor signal, the first sensor signal, and the second sensor signal.

The heater is routed through an aircraft component and the resistive heating element provides heat for the aircraft component.

The aircraft component is an air data probe.

A signal processor is configured to amplify and digitize the leakage sensor signal.

The prediction processor is configured to determine remaining life of the heater.

The prediction processor is configured to identify that the resistive heating element is compromised when there are at least one of noise and spikes present in the leakage sensor signal.

The prediction processor is configured to identify that the insulation is compromised when the leakage sensor signal is elevated over time.

The leakage sensor signal is a time varying signal.

The leakage sensor is a leakage sense resistor connected between the heater and an electrical ground.

The heater further comprises a metallic sheath surrounding the insulation such that the insulation is between the resistive heating element and the sheath, wherein the leakage sensor is connected between the sheath and the electrical ground.

A system for an aircraft includes a heater comprising: a resistive heating element; and insulation surrounding the resistive heating element; wherein a first current flows into the resistive heating element to provide heat and a second current flows out of the resistive heating element; a first sensor configured to produce a first sensor signal representing the first current; a second sensor configured to produce a second sensor signal representing the second current; and a prediction processor configured to predict heater failure based on the first sensor signal and the second sensor signal.

The system of the preceding paragraph can optionally include, additionally and/or alternatively, any one or more of the following features, configurations and/or additional components:

A signal processor configured to create a difference voltage by subtracting the second sensor signal from the first sensor signal.

The system further comprises a leakage sensor configured to produce a leakage sensor signal representing a leakage current from the heater, wherein the prediction processor is configured to predict heater failure based on the difference voltage and the leakage sensor signal.

The signal processor is configured to amplify and digitize the difference voltage.

The prediction processor is configured to identify that the resistive heating element is compromised when there are at least one of noise and spikes present in the difference voltage.

The prediction processor is configured to identify that the insulation is compromised when the difference voltage is elevated over time.

The difference voltage is a time varying signal.

The heater is routed through an aircraft component and the resistive heating element provides heat for the aircraft component.

The prediction processor is configured to determine remaining life of the heater.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for an aircraft, the system comprising:
   a heater comprising:
      a resistive heating element;
      insulation surrounding the resistive heating element; and
      a metallic sheath surrounding the insulation such that the insulation is between the resistive heating element and the sheath;
      wherein a first current flows into a first end of the resistive heating element during operation of the heater to provide heat and a second current flows out of a second end of the resistive heating element;

a leakage sensor electrically connected to the metallic sheath and configured to produce a leakage sensor signal representing a leakage current from the heater; and a prediction processor configured to predict heater failure based on the leakage sensor signal;

wherein the heater is routed through an aircraft component and the resistive heating element provides heat for the aircraft component.

2. The system of claim 1, wherein the system further comprises:

a first sensor connected to the first end of the resistive heating element to produce a first sensor signal representing the first current; and a second sensor connected to the second end of the resistive heating element to produce a second sensor signal representing the second current;

wherein the prediction processor is configured to predict heater failure based on the leakage sensor signal, the first sensor signal, and the second sensor signal.

3. The system of claim 1, wherein the prediction processor is configured to determine remaining life of the heater.

4. The system of claim 1, wherein the aircraft component is an air data probe.

5. The system of claim 1, wherein the leakage sensor signal is a time varying signal.

6. A system for an aircraft, the system comprising:
a heater comprising:
a resistive heating element;
insulation surrounding the resistive heating element; and
a metallic sheath surrounding the insulation such that the insulation is between the resistive heating element and the sheath;
wherein a first current flows into a first end of the resistive heating element during operation of the heater to provide heat and a second current flows out of a second end of the resistive heating element;
a leakage sensor electrically connected to the metallic sheath and configured to produce a leakage sensor signal representing a leakage current from the heater;
a prediction processor configured to predict heater failure based on the leakage sensor signal; and
a signal processor configured to amplify and digitize the leakage sensor signal.

7. A system for an aircraft, the system comprising:
a heater comprising:
a resistive heating element;
insulation surrounding the resistive heating element; and
a metallic sheath surrounding the insulation such that the insulation is between the resistive heating element and the sheath;
wherein a first current flows into a first end of the resistive heating element to provide heat and a second current flows out of a second end of the resistive heating element;
a leakage sensor electrically connected to the metallic sheath and configured to produce a leakage sensor signal representing a leakage current from the heater; and
a prediction processor configured to predict heater failure based on the leakage sensor signal;
wherein the prediction processor is configured to identify that the resistive heating element is compromised when there are at least one of noise and spikes present in the leakage sensor signal.

8. A system for an aircraft, the system comprising:
a heater comprising:
a resistive heating element;
insulation surrounding the resistive heating element; and
a metallic sheath surrounding the insulation such that the insulation is between the resistive heating element and the sheath;
wherein a first current flows into a first end of the resistive heating element during operation of the heater to provide heat and a second current flows out of a second end of the resistive heating element;
a leakage sensor electrically connected to the metallic sheath and configured to produce a leakage sensor signal representing a leakage current from the heater; and
a prediction processor configured to predict heater failure based on the leakage sensor signal;
wherein the prediction processor is configured to identify that the insulation is compromised when the leakage sensor signal is elevated over time.

9. A system for an aircraft, the system comprising:
a heater comprising:
a resistive heating element;
insulation surrounding the resistive heating element; and
a metallic sheath surrounding the insulation such that the insulation is between the resistive heating element and the sheath;
wherein a first current flows into a first end of the resistive heating element during operation of the heater to provide heat and a second current flows out of a second end of the resistive heating element;
a leakage sensor electrically connected to the metallic sheath and configured to produce a leakage sensor signal representing a leakage current from the heater; and
a prediction processor configured to predict heater failure based on the leakage sensor signal;
wherein the leakage sensor is a leakage sense resistor connected between the sheath and an electrical ground.

10. A system for an aircraft, the system comprising:
a heater comprising:
a resistive heating element;
insulation surrounding the resistive heating element; and
a metallic sheath surrounding the insulation such that the insulation is between the resistive heating element and the sheath;
wherein a first current flows into a first end of the resistive heating element to provide heat and a second current flows out of a second end of the resistive heating element;
a first sensor connected to the first end of the resistive heating element to produce a first sensor signal representing the first current;
a second sensor connected to the second end of the resistive heating element to produce a second sensor signal representing the second current;
a leakage sensor electrically connected to the metallic sheath and configured to produce a leakage sensor signal representing a leakage current from the heater;
a signal processor configured to create a difference voltage by subtracting the second sensor signal from the first sensor signal; and a prediction processor configured to predict heater failure based on the difference voltage and the leakage sensor signal;

wherein the heater is routed through an aircraft component and the resistive heating element provides heat for the aircraft component.

11. A system for an aircraft, the system comprising:
a heater comprising:
- a resistive heating element;
- insulation surrounding the resistive heating element; and
- a metallic sheath surrounding the insulation such that the insulation is between the resistive heating element and the sheath;
- wherein a first current flows into a first end of the resistive heating element to provide heat and a second current flows out of a second end of the resistive heating element;

a first sensor connected to the first end of the resistive heating element to produce a first sensor signal representing the first current;

a second sensor connected to the second end of the resistive heating element to produce a second sensor signal representing the second current;

a leakage sensor electrically connected to the metallic sheath and configured to produce a leakage sensor signal representing a leakage current from the heater;

a signal processor configured to create a difference voltage by subtracting the second sensor signal from the first sensor signal; and a prediction processor configured to predict heater failure based on the difference voltage and the leakage sensor signal.

12. The system of claim 11, wherein the signal processor is configured to amplify and digitize the difference voltage.

13. The system of claim 11, wherein the prediction processor is configured to identify that the resistive heating element is compromised when there are at least one of noise and spikes present in the difference voltage.

14. The system of claim 11, wherein the prediction processor is configured to identify that the insulation is compromised when the difference voltage is elevated over time.

15. The system of claim 11, wherein the difference voltage is a time varying signal.

16. The system of claim 11, wherein the prediction processor is configured to determine remaining life of the heater.

* * * * *